United States Patent
Wakamatsu et al.

(10) Patent No.: US 7,812,651 B2
(45) Date of Patent: *Oct. 12, 2010

(54) PLL APPARATUS

(75) Inventors: Shunichi Wakamatsu, Sayama (JP); Tsuyoshi Shiobara, Sayama (JP); Naoki Onishi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 89 days.

This patent is subject to a terminal disclaimer.

(21) Appl. No.: 12/225,573

(22) PCT Filed: Mar. 30, 2007

(86) PCT No.: PCT/JP2007/057686

§ 371 (c)(1),
(2), (4) Date: Oct. 27, 2008

(87) PCT Pub. No.: WO2007/114498

PCT Pub. Date: Oct. 11, 2007

(65) Prior Publication Data
US 2009/0167382 A1 Jul. 2, 2009

(30) Foreign Application Priority Data
Mar. 31, 2006 (JP) ............................ 2006-100652

(51) Int. Cl.
H03L 7/06 (2006.01)

(52) U.S. Cl. ........................ 327/156; 327/147

(58) Field of Classification Search ................. 327/147, 327/156; 331/DIG. 2; 455/260
See application file for complete search history.

(56) References Cited

U.S. PATENT DOCUMENTS

| 6,198,353 | B1* | 3/2001 | Janesch et al. ............... 331/16 |
| 7,099,642 | B2* | 8/2006 | Fernandez-Corbaton et al. ........................... 455/255 |
| 7,312,642 | B1* | 12/2007 | Li et al. ...................... 327/105 |
| 2009/0146742 | A1* | 6/2009 | Onishi et al. .................. 331/10 |

FOREIGN PATENT DOCUMENTS

| JP | 2001-326573 | 11/2001 |
| JP | 2002-505827 | 2/2002 |
| JP | 2003-289248 | 10/2003 |
| JP | 2004-235858 | 8/2004 |
| JP | 2005-109551 | 4/2005 |
| WO | WO-99/49575 | 9/1999 |

* cited by examiner

Primary Examiner—Hai L Nguyen
(74) Attorney, Agent, or Firm—Jordan and Hamburg LLP (57) ABSTRACT

Provided is a PLL apparatus realizing extremely high frequency stability. As a concrete means for solving the problem, an A/D (analog/digital) conversion unit samples a standard signal based on 40 MHz frequency signal, which is a rectangular wave, from an oven controlled crystal oscillator (OCXO), and an orthogonal transformation unit applies orthogonal transformation to a digital signal from the A/D conversion unit to extract a real part (I) and an imaginary part (Q) which are complex expression of a phase vector equivalent to a phase difference between the standard signal and the frequency signal from the OCXO. An angular velocity of this vector is detected and a direct-current voltage according to the angular velocity is generated and supplied to the OCXO via a PWM control unit.

4 Claims, 10 Drawing Sheets

(a) OUTPUT FREQUENCY = 40MHz (b)

Fig. 11

(a) OUTPUT FREQUENCY BECOMES LOWER THAN 40MHz (b)

PRIOR ART

_US 7,812,651 B2_

PLL APPARATUS

TECHNICAL FIELD

The present invention relates to a PLL (Phase Locked Loop) apparatus.

BACKGROUND ART

In base stations of mobile communication, terrestrial digital broadcasting, and the like, a frequency reference signal is required to have high frequency stability. A standard signal is obtained from a cesium frequency standard oscillator, a rubidium standard oscillator, and the like, but since the standard signal thereof generally costs high, each of the base stations distributes the standard signal when using it. The distributed standard signal is used, for example, as a reference signal for phase comparison of a PLL circuit, and from this PLL circuit, a reference signal such as, for example, a reference clock signal with a required frequency can be obtained.

Figure 14:
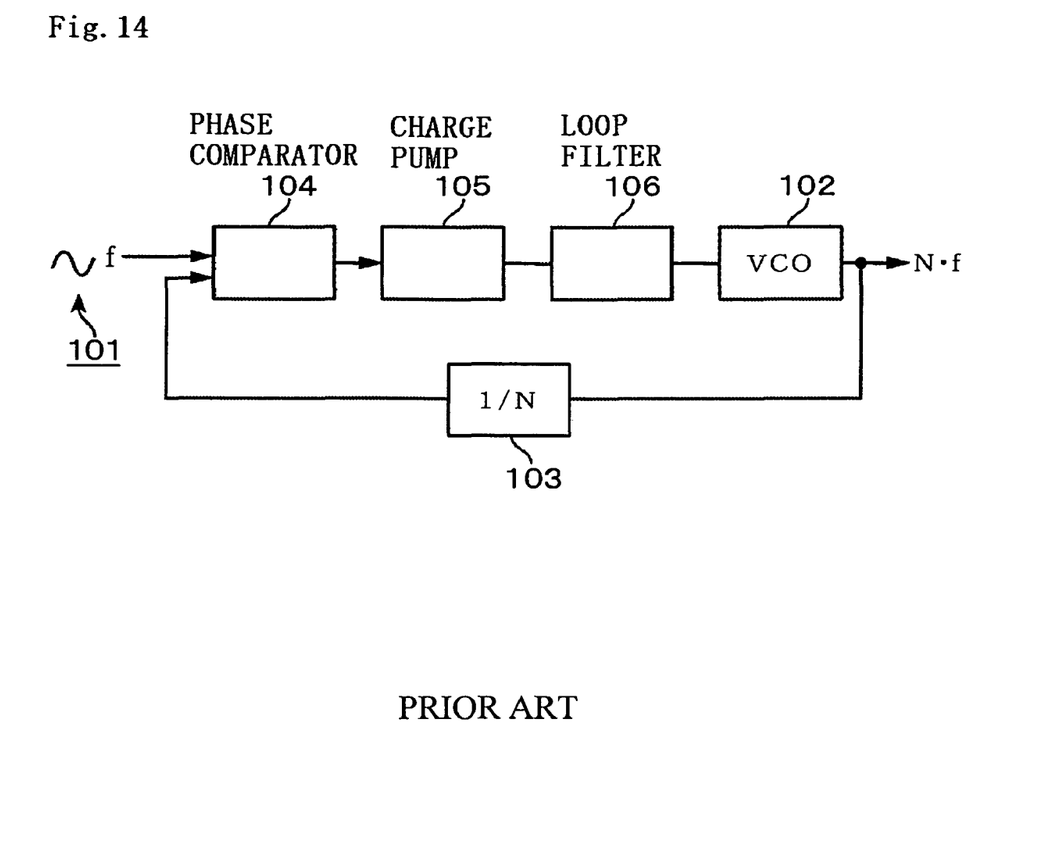
FIG. 14 is a block diagram showing a conventional PLL apparatus.

As shown in FIG. 14, generally, in a PLL circuit, a phase comparator 104 compares a standard signal 101 and a signal that a frequency divider circuit 103 obtains by frequency-dividing an output signal of a voltage-controlled oscillator 102, and a charge pump 105 gives a signal according to a phase difference between these signals and supplies its output to the voltage-controlled oscillator 102 via a loop filter 106, whereby the PLL circuit performs PLL control to generate a high-accuracy signal (patent document 1).

There has been an increasing demand for higher accuracy of a frequency reference signal in, for example, a base station. For example, the present inventor has been trying to develop a frequency synthesizer having frequency resolution in a 1 Hz unit or lower, but a reference clock signal in such an apparatus needs to have extremely high frequency stability, and a conventional PLL circuit has difficulty in satisfying this requirement.

Patent document 1
Japanese Patent Application Laid-open No. 2001-326573

DISCLOSURE OF THE INVENTION

The present invention was made under such circumstances and has its object to provide a PLL apparatus realizing extremely high frequency stability.

A PLL apparatus of the present invention includes:

a voltage-controlled oscillation unit oscillating a frequency signal, which is a rectangular wave signal, having a frequency according to a supplied direct-current voltage;

an analog/digital conversion unit sampling an external standard signal which is a stable sinusoidal signal, based on the frequency signal from the voltage-controlled oscillation unit, and outputting a sampling value as a digital signal;

an orthogonal transformation unit applying orthogonal transformation to the digital signal by an orthogonal transformation unit 2 to extract a real part and an imaginary part which are complex expression of a phase vector equivalent to a phase difference between the frequency signal and the standard signal;

an angular velocity calculation unit calculating an angular velocity of the vector based on time-series data of the real part and the imaginary part extracted by the orthogonal transformation unit; and a means for supplying the voltage-controlled oscillation unit with the direct-current voltage according to the angular velocity calculated by the angular velocity calculation unit.

The voltage-controlled oscillation unit is, for example, an oven-controlled crystal oscillator. The means for supplying the voltage-controlled oscillation unit with the direct-current voltage may include: a pulse width modulation unit outputting a pulse train with a duty ratio according to the angular velocity of the vector; and a means for smoothing the pulse train output from the pulse width modulation unit.

A preferable example of the angular velocity calculation means is one which executes an arithmetic operation of $\{Q(n)-Q(n-1)\}\cdot I(n)-\{I(n)-I(n-1)\}\cdot Q(n)$, where $I(n)$ and $Q(n)$ are respectively the real part and the imaginary part corresponding to the sampling value at a given timing, and $I(n-1)$ and $Q(n-1)$ are respectively the real part and the imaginary part corresponding to the sampling value at a timing preceding the given timing.

In the present invention, the external standard signal is sampled based on the frequency signal (oscillation output) from the voltage-controlled oscillation unit, the phase difference therebetween is expressed by the vector, and the oscillation output is controlled according to the angular velocity of the vector. That is, the vector is in a stopped state under the constant phase difference, but if the phase difference changes, the vector rotates, so that the loop operates so as to stop the vector. Therefore, in the present invention, since the phase difference between the frequency signal from the voltage-controlled oscillation unit and the external standard signal is expressed by a digital value, by adjusting the bit numbers thereof, it is possible to make the phase difference constant with high accuracy, and providing that the standard signal has high frequency stability, it is possible to obtain a frequency signal with a desired frequency having extremely high frequency stability (on the condition that the frequency is twice the frequency of the standard signal since the standard signal is sampled). Therefore, the present invention is effective as a reference clock signal generation apparatus such as a frequency synthesizer capable of setting the frequency in a unit of 1 Hz.

BEST MODE FOR CARRYING OUT THE INVENTION

Figure 1:
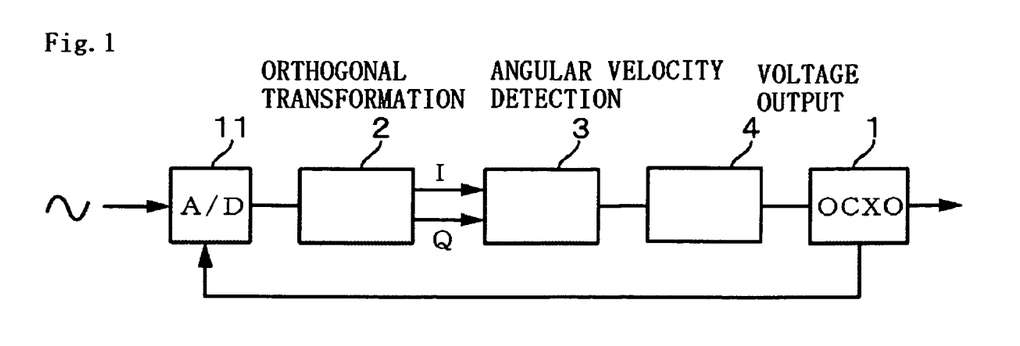
FIG. 1 is a block diagram showing an overview of a PLL apparatus according to the present invention.

A PLL circuit of the present invention operates based on a novel principle, and therefore, firstly, an overview of the principle of the operation of the present invention will be briefly described with reference to FIG. 1. In this example, a 40 MHz frequency signal which is, for example, a rectangular wave is obtained based on an external standard signal, for example, a 10 MHz sinusoidal signal which is a standard signal obtained from, for example, a cesium frequency standard oscillator, a rubidium standard oscillator, or the like. This frequency signal may be a sinusoidal signal. The principle of the operation of the present invention is as follows. First, based on a 40 MHz frequency signal which is a rectangular wave output from a voltage-controlled oscillator, for example, an oven-controlled crystal oscillator (OCXO) 1, an A/D (analog/digital) conversion unit 11 samples the standard signal to obtain a digital signal.

Next, an orthogonal transformation unit 2 applies orthogonal transformation to the digital signal to extract a real part (real axis component (I)) and an imaginary part (imaginary axis component (Q)) representing a phase difference between the standard signal and the frequency signal (hereinafter, also referred to as a clock signal) from the oven-controlled crystal oscillator 1, that is, a real part (I) and an imaginary part (Q) which are complex expression of a phase vector equivalent to the phase difference. Then, an angular velocity detection unit 3 detects an angular velocity of the vector, a voltage output unit 4 generates a direct-current voltage according to the angular velocity, and the crystal oscillator 1 outputs a frequency signal according to the direct-current voltage. Therefore, when the phase difference between the standard signal and the frequency signal of the crystal oscillator 1 changes, the vector rotates, and therefore, an output frequency of the crystal oscillator is controlled so as to stop the rotation. That is, the circuit in FIG. 1 forms a PLL, and when the aforesaid phase difference is locked, the frequency signal of the crystal oscillator 1 is also stably kept at 40 MHz, providing that the standard signal is stably kept at 10 MHz.

Figure 2:
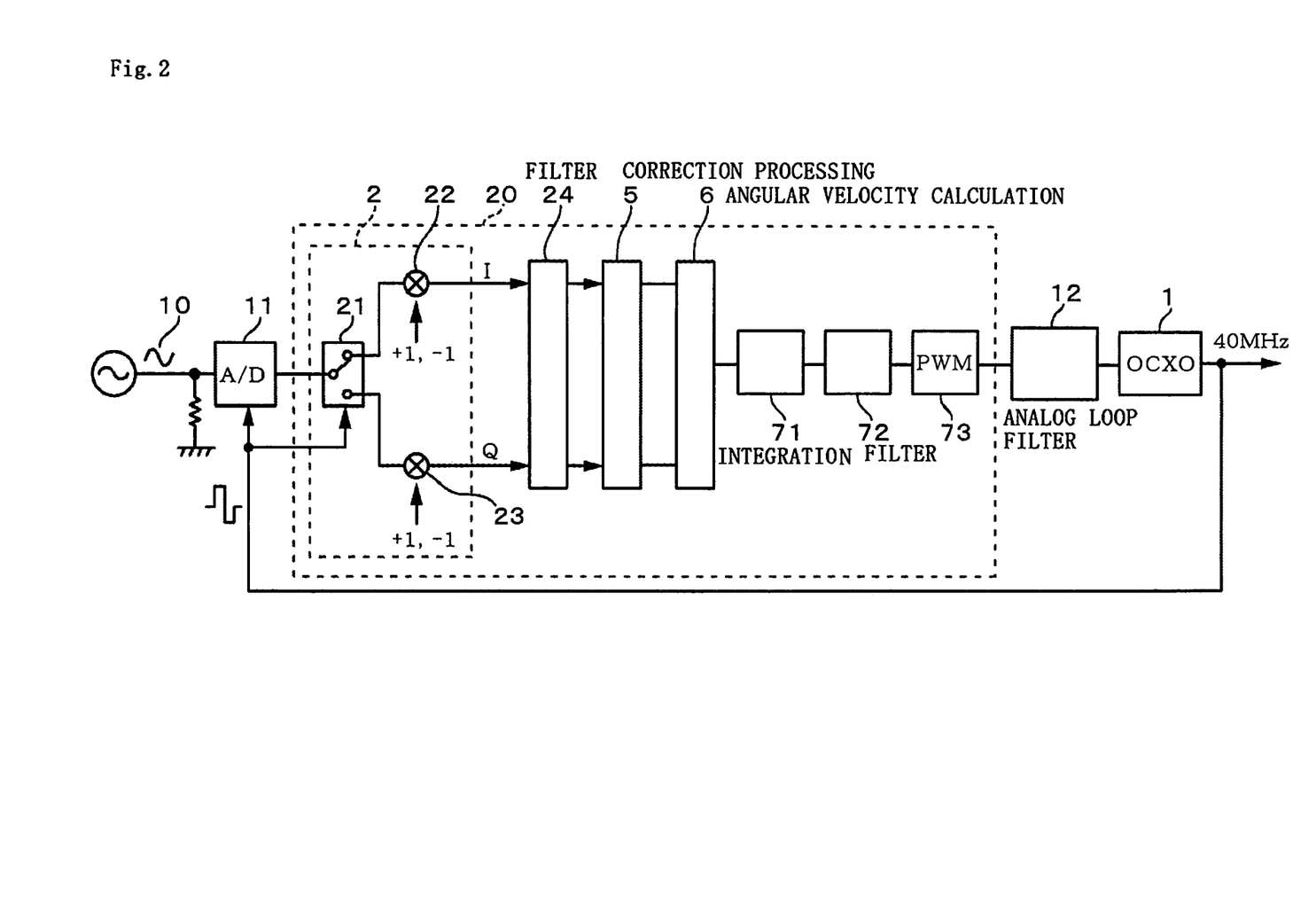
FIG. 2 is a block diagram showing the whole configuration of an embodiment of the PLL apparatus according to the present invention.

Hereinafter, an embodiment of the present invention will be described in detail. In FIG. 2, a portion 20 surrounded by the dotted line is provided in a computer, and units up to a unit generating a later-described PWM signal are executed by software. In this example, a standard signal 10 and a frequency signal from the crystal oscillator 1 are 10 MHz and 40 MHz respectively and thus are in a 1:4 relation, and therefore, the orthogonal transformation unit (carrier remove) 2 sequentially multiplies the digital signals from the A/D conversion unit 11 by +1, +1, thereby extracting sets of the real part (I) and the imaginary part (Q), and then it sequentially multiplies the digital signals by −1, −1, thereby extracting sets of the real part (I) and the imaginary part (Q), and by repeating this calculation, the phase difference between the standard signal 10 and the frequency signal from the crystal oscillator 1 can be monitored.

Figure 3:
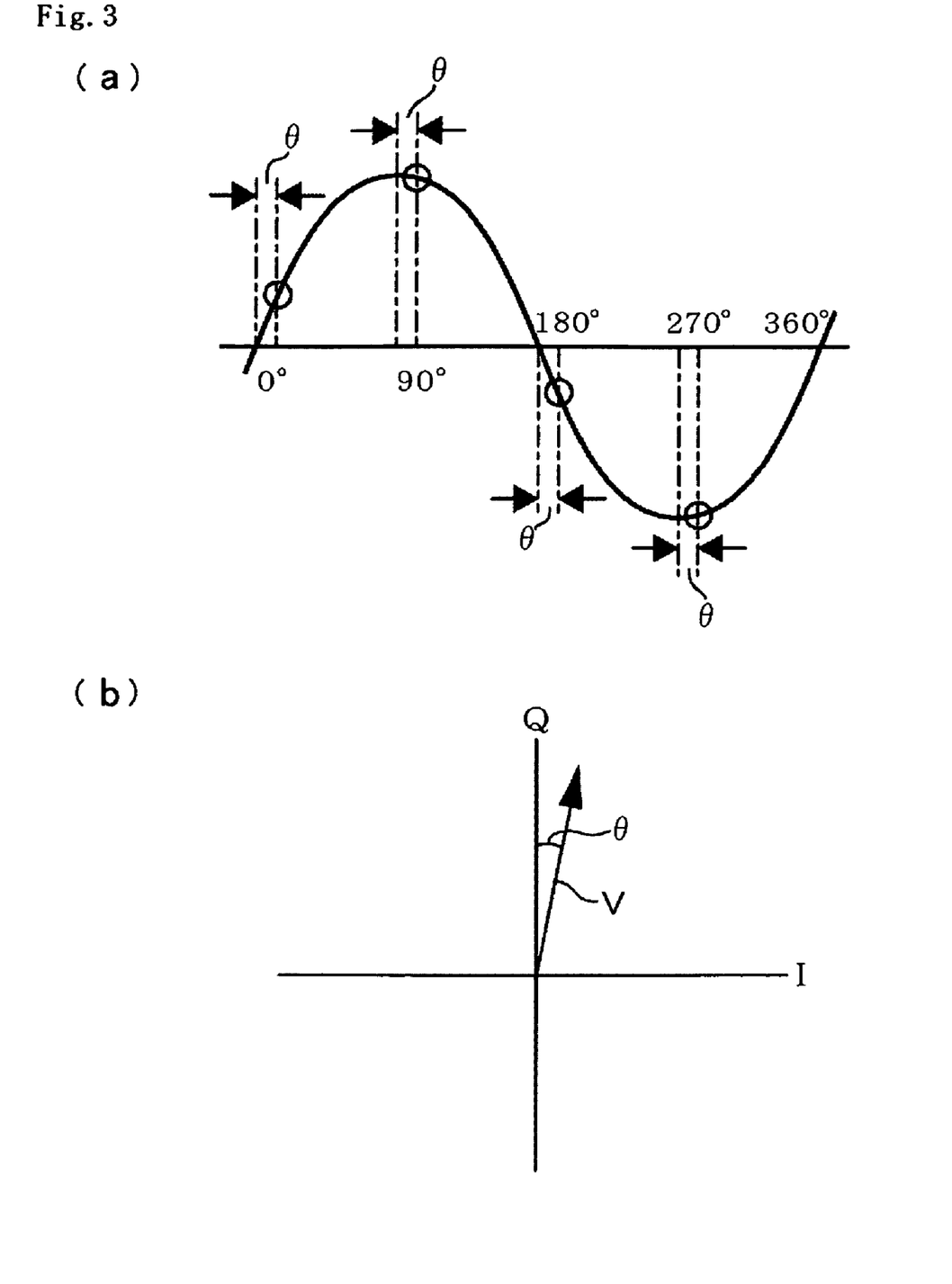
FIG. 3 are explanatory charts showing how a phase difference between a standard signal and a frequency signal of a voltage-controlled oscillation unit is related to a vector having this phase difference.

A state of this calculation is shown in FIG. 3. Assuming that the sampling timing of the standard signal 10 is delayed by θ, when the 1:4 frequency relation is maintained, the sampling is performed at timings marked by the circles shown in FIG. 3(a). Therefore, when each of the first two sampling values is multiplied by +1, a real part and an imaginary part of a vector deviated in phase from the I axis (real axis) by −θ as shown in FIG. 3(b) are obtained as a set of values. Further, when each of the next two sampling values is multiplied by −1, the real part and the imaginary part of a vector deviated in phase from the I axis (real axis) by −θ are obtained as a set of values. That is, if the phase difference θ is constant in these samplings, the vector is kept stopped.

In this example, for the above calculation, in the orthogonal transformation unit 2, a switch 21 is sequentially changed based on the frequency signal from the crystal oscillator 1 and a multiplying unit 22 in a selected line multiplies the output of the A/D conversion unit 11 by +1 and −1 alternately to obtain the real parts, and a multiplying unit 23 in the selected other line multiplies the output of the A/D conversion unit 11 by +1 and −1 alternately to obtain the imaginary parts.

On a subsequent stage of the orthogonal transformation unit 2, a filter 24 is provided. This filter 24 has a function of reducing attenuation distortion of a band of the external standard signal to reduce unnecessary band.

Figure 4:
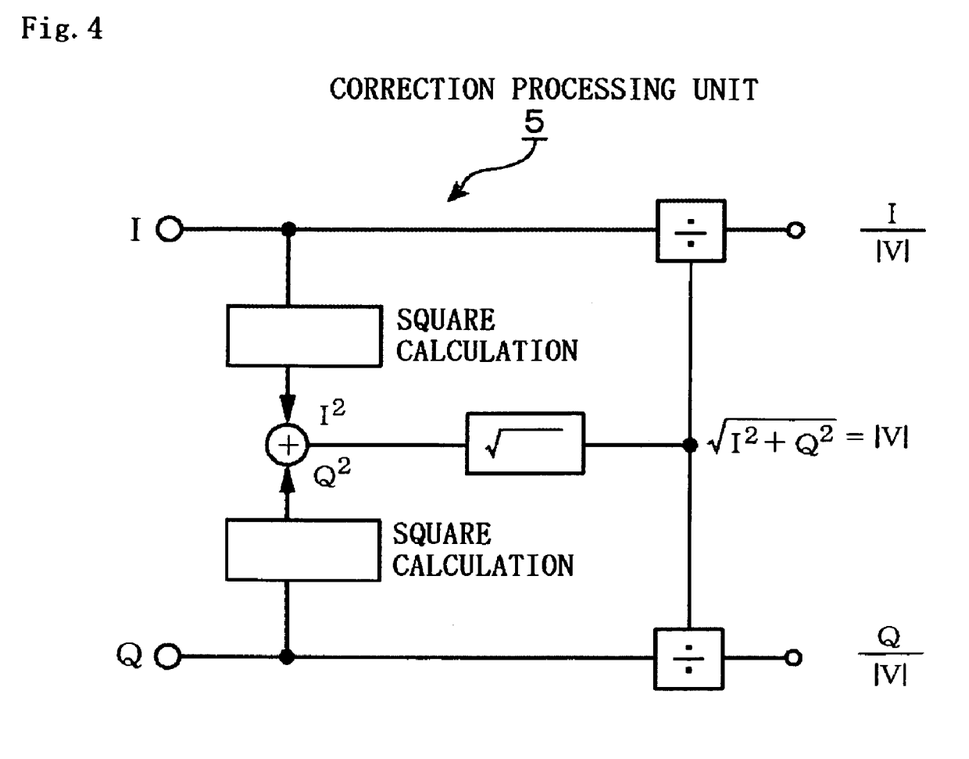
FIG. 4 is a block diagram showing a correction processing unit used in the embodiment.

On a subsequent stage of the filter 24, a correction processing unit 5 applying correction processing to an I value as the real part of the vector and a Q value as the imaginary part of the vector is provided. This correction processing unit 5 divides the I value and the Q value by a scalar quantity of the vector to find the I value and the Q value per unit length of the vector. That is, as shown in FIG. 4, with the vector V being assigned the reference symbol V, the correction processing unit 5 squares the I value and the Q value to add the squared values and calculates a square root of the addition value to find the scalar quantity |V| of the vector V, and divides the I value and the Q value by |V|.

Figure 5:
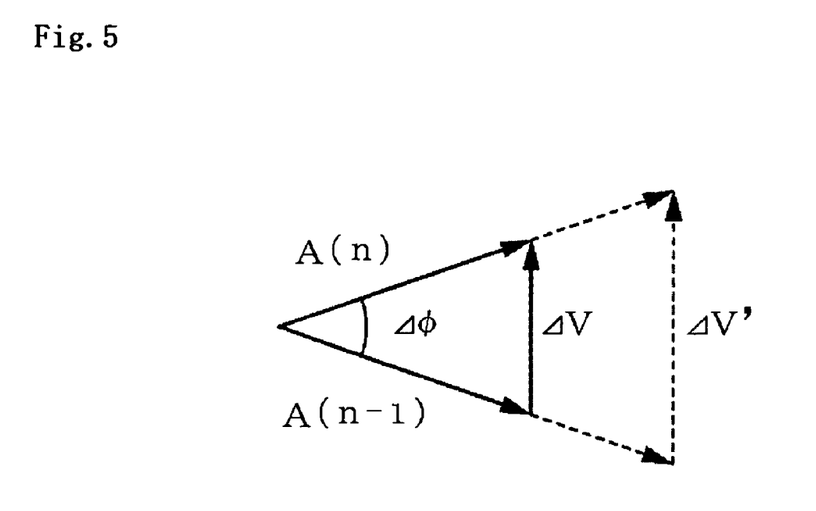
FIG. 5 is an explanatory chart showing how a detection error occurs when the vector is elongated.

The reason for thus correcting the I value and the Q value is as follows. In this embodiment, in calculating an amount of the rotation of the vector V (a change amount of the phase difference), this is estimated based on a factor including a vector ΔV connecting a vector V(n) obtained in the n-th sampling and a vector V(n−1) obtained in the (n−1)-th sampling, as shown in FIG. 5. Therefore, if the vector ΔV is, what is called, elongated to ΔV' due to, for example, fluctuation of a waveform of the standard signal, the correspondence relation between ΔV and a rotation amount Δφ is broken, which may possibly deteriorate reliability of a detection value of the angular velocity of the vector. Therefore, by the aforesaid correction processing, the I values and the Q values at respective timings can all be uniformly changed to values corresponding to the unit length of the vector, which can eliminate the influence of the elongation of the vector.

Figure 6:
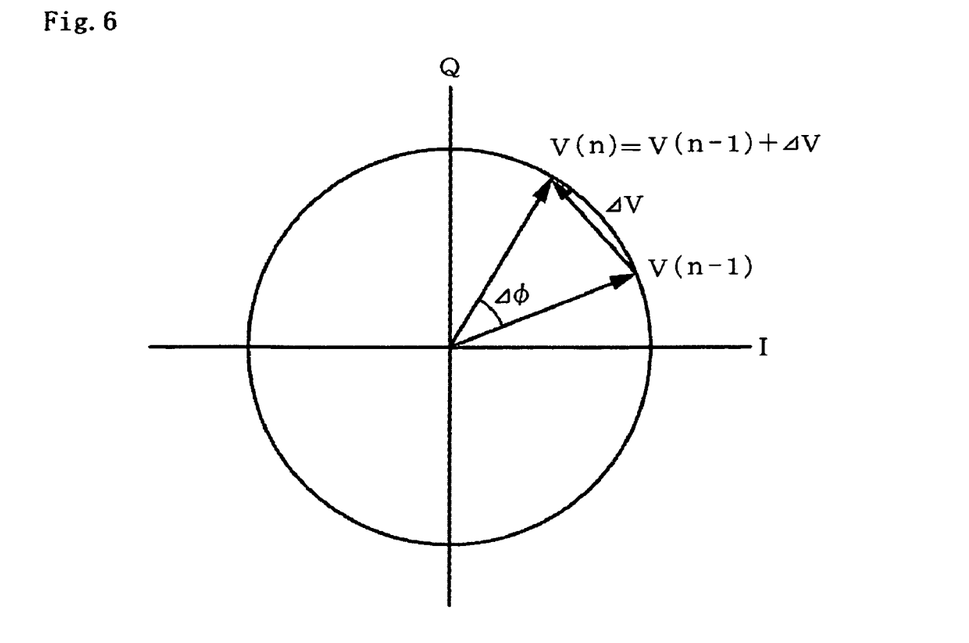
FIG. 6 is an explanatory chart showing a phase difference (angular velocity) between vectors obtained in samplings at two sequential timings.

Further, as shown in FIG. 2, on a subsequent stage of the correction processing unit 5, an angular velocity calculation unit 6 for calculating the angular velocity of the vector is provided. The angular velocity calculation unit 6 has a function of finding the angular velocity of the vector, which means that it has a function of detecting a change amount of the phase difference. The angular velocity calculation unit 6 will be described with reference to FIG. 6 and FIG. 7. As shown in FIG. 6, if the angular velocity (frequency) of the vector is sufficiently smaller than a sampling frequency, the angle Δφ made by the vector V(n−1) obtained in the (n−1)-th sampling and the vector V(n)=V(n−1)+ΔV obtained in the n-th sampling can be approximated by the expression (4), where K is a constant. Δφ is a difference between a phase φ of V(n) and a phase φ(n−1) of V(n−1), imag is the imaginary part, and conj {V(n)} is a conjugate vector of V(n).

$$\Delta\phi = K \cdot \text{imag}[\Delta V \cdot \text{conj}\{V(n)\}] \quad (1)$$

Here, ΔV and conj {V(n)} are complex-expressed by the expression (2) and the expression (3), where I(n) and Q(n) are the I value and the Q value, respectively, corresponding to the n-th sampling.

$$\Delta V = \Delta I + j\Delta Q \quad (2)$$

$$\text{conj}\{V(n)\} = I(n) - jQ(n) \quad (3)$$

ΔI is I(n)−I(n−1), and ΔQ is Q(n)−Q(n−1). By substituting the expression (2) and the expression (3) in the expression (1) and calculating the resultant expression, Δφ is expressed by the expression (4).

$$\Delta\phi = \Delta Q \cdot I(n) - \Delta I \cdot Q(n) \quad (4)$$

Figure 7:
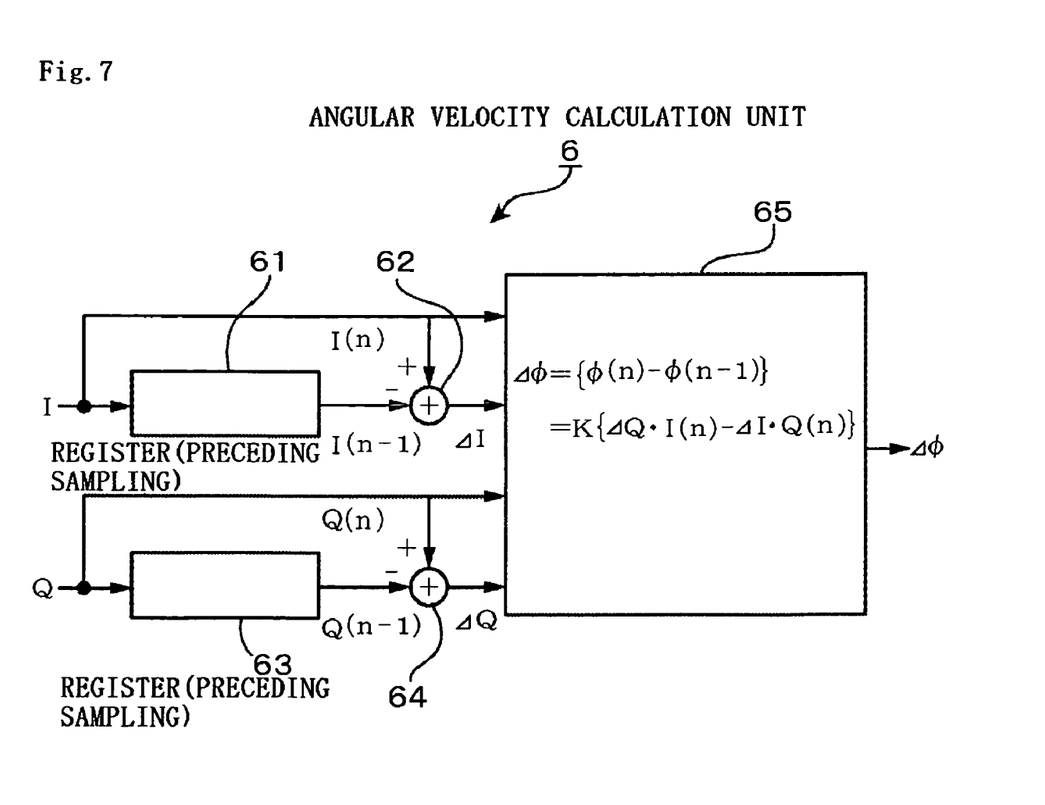
FIG. 7 is a block diagram showing an angular velocity calculation unit used in the embodiment.

The angular velocity calculation unit 6 finds an approximate value of Δφ by calculating the expression (7), and is structured as shown in FIG. 7. If the I value input to the angular velocity calculation unit 6 is I(n) which is a value corresponding to the n-th sampling, a register 61 is holding I(n−1) corresponding to the (n−1)-th sampling which is an immediately preceding timing, and a comparator circuit unit 62 compares these values to extract the difference ΔI between I(n) and I(n−1) and inputs I(n) and ΔI to a calculation unit 65. The Q value is similarly processed by a register 63 and a comparator circuit unit 64, and Q(n) and ΔQ are input to the calculation unit 65. Then, the calculation unit 65 finds Δφ by calculating the expression (4). To be in more detail, the calculation result of the calculation unit 65 is estimated Δφ.

Here, once the vectors ΔV(n−1) and V(n) are found, various mathematical methods can be used as a method for finding or estimating the angle Δφ, and the present invention is not limited to the above-described method.

Returning to FIG. 2, on a subsequent stage of the angular velocity calculation unit 6, an integration circuit unit 71 integrating the angular velocities calculated by the angular velocity calculation unit, a lag-lead filter 72 smoothing an integration value from the integration circuit unit 71, and a PWM control unit 73 outputting a pulse train PWM-controlled based on the output value from the lag-lead filter 72 are provided in this order. The PWM control unit 73 has a function of outputting the pulse train whose duty ratio is controlled based on the output value from the lag-lead filter 72 and outputs the pulse train with the duty ratio according to the output value every 100 ms, for instance.

On a subsequent stage of the PWM control unit 73, an analog loop filter 12 is provided, and this analog loop filter 12 has a function of integrating the pulse train from the PWM control unit 73 to smooth it into a direct-current voltage and supplying the direct-current voltage to a control terminal of the crystal oscillator 1. The PWM control unit 73 and the analog loop filter 12 correspond to the voltage output unit 4 in FIG. 1.

Figure 8:
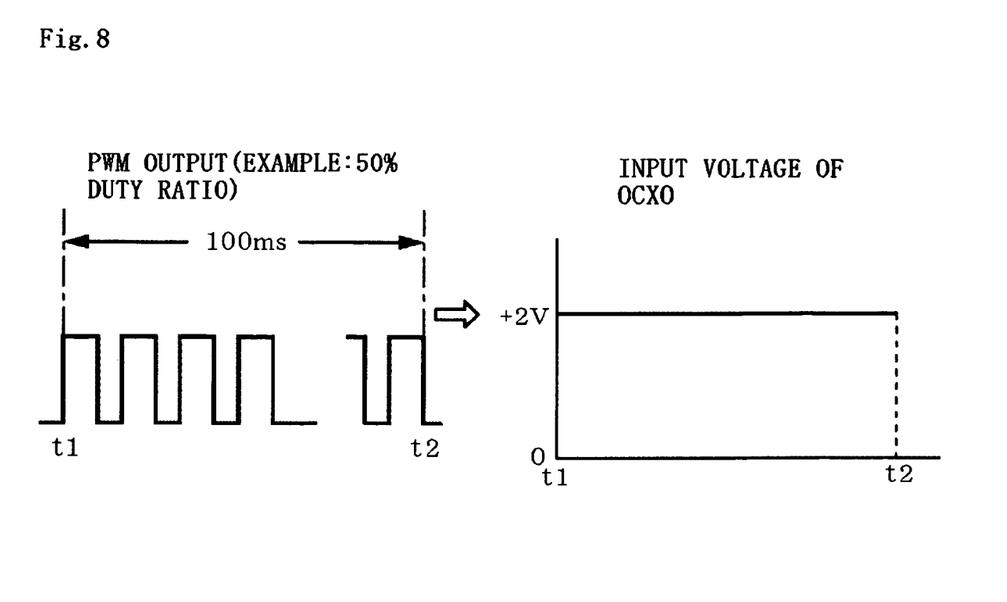
FIG. 8 is an explanatory chart showing a relation between an output of a PWM control unit and an input voltage of an OCXO.
Figure 9:
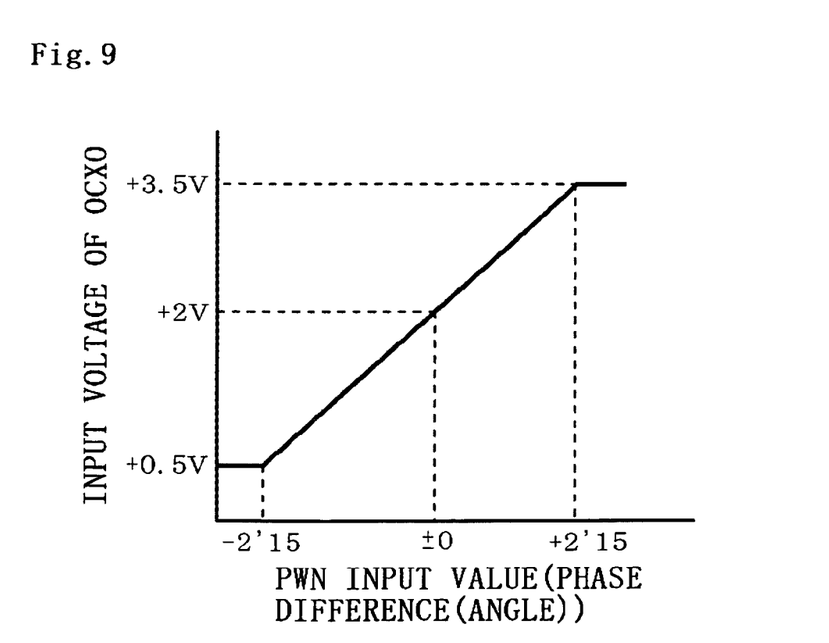
FIG. 9 is a characteristic chart showing a relation between an input value of the PWM and the input voltage of the OCXO.

Here, the PWM control unit 73 and the analog loop filter 12 will be more concretely described. As shown in FIG. 8, for example, when the angular velocity of the vector is zero (if there is no change in the phase difference), the PWM control unit 73 outputs a pulse train with a 50% duty ratio based on the output value from the lag-lead filter 72 only for 100 ms, for instance. If the level of this pulse train is 4 V, the output voltage of the analog loop filter 12, that is, an input voltage of the crystal oscillator 1 is +2 V corresponding to 50%. Then, when the vector rotates, a pulse train with a duty ratio according to the angle velocity is output from the PWM control unit 73. A relation between the input value of the PWM control unit 73 and the output value of the analog loop filter 12 can be that shown in FIG. 9, for instance. In FIG. 9, the horizontal axis represents a value corresponding to the rotation angle of the vector.

The structure of this embodiment has been thus described as a block diagram, but actual calculation or data processing is executed by software.

Next, the operation of the above-described embodiment will be described. Based on the 40 MHz frequency signal, which is, for example, a rectangular wave, from the crystal oscillator 1, the external 10 MHz standard signal is sampled, and the sampling values are given to the orthogonal transformation unit 2. In the orthogonal transformation unit 2, the switch 21 is switched alternately to the I value side and the Q value side based on the 40 MHz clock as previously described, and therefore, a set of the I value and the Q value is extracted in response to a 20 MHz clock. The I value and the Q value correspond to the real axis component and the imaginary axis component of the vector V when the vector having the phase difference θ between the 40 MHz frequency signal from the crystal oscillator 1 and the 10 MHz standard signal is expressed in a complex plane. Then, these I value and Q value are subjected to high-band component removal processing in the filter 24, and subsequently, the correction processing unit 5 performs the correction processing (see FIG. 4 and FIG. 5) of the vector V determined by the I value and the Q value as previously described. Then, based on time-series data of the I value and the Q value, the angular velocity calculation unit 6 finds the angular velocity Δφ of the vector V as shown in FIG. 7. In this case, since Δφ is sufficiently small and is handled as sin Δφ=Δφ, the angular velocity Δφ is estimated based on the length of the vector ΔV connecting the vector V(n−1) at a given timing and the vector V(n) at the next timing (this timing is a timing of the 20 MHz clock).

The values of the angular velocity thus obtained are integrated and smoothed, so that the pulse train with a duty ratio corresponding to the resulting value is generated. Next, this pulse train is smoothed and as a result the direct-current voltage is generated, so that the output frequency of the crystal oscillator 1 is controlled by the direct-current voltage.

Figure 10:
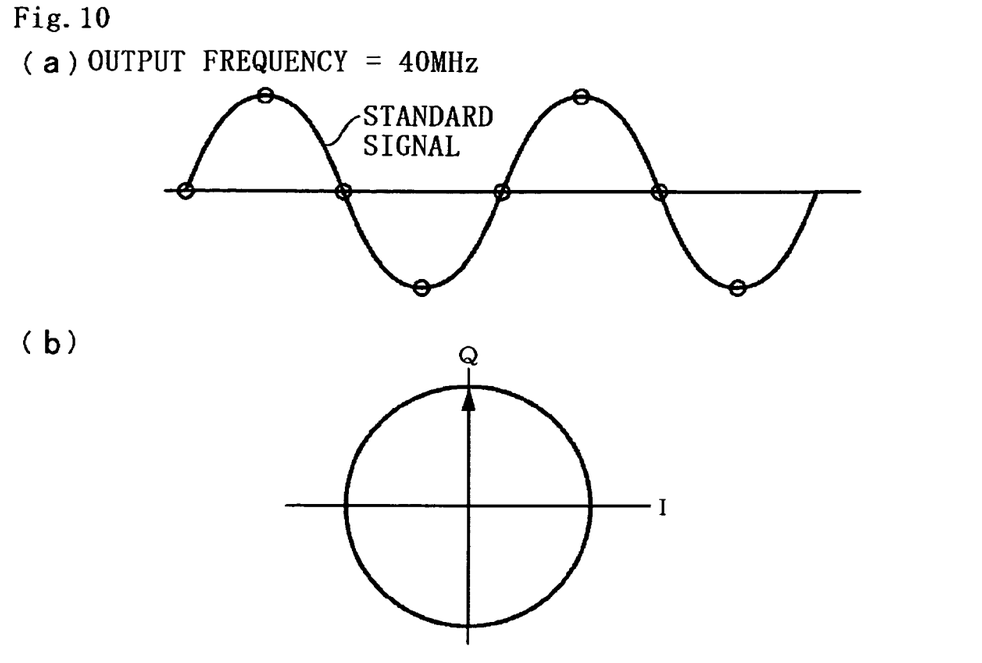
FIG. 10 are explanatory charts showing a state of sampling and a vector when a phase difference between the standard signal and the frequency signal of the voltage-controlled oscillation unit does not change.

Here, assuming that the external standard signal is stably kept at 10 MHz, when the output frequency of the crystal oscillator 1 is 40 MHz, the four sampling points in one cycle of the standard signal are at positions deviated in phase by θ from 0 degree, 90 degrees, 180 degrees, and 270 degrees respectively as shown in FIG. 3(a). Therefore, in this case, the phase difference between the standard signal and the frequency signal of the crystal oscillator 1 is constantly θ, and the vector V is in a stopped state, as shown in FIG. 3(b). Here, the description will be given on assumption that θ is zero for simplifying the illustration of the drawing. When the phase difference is constantly zero, the sampling is performed at timings shown in FIG. 10(a), and a set of the I value and the Q value is (0, 1), and the vector V is stopped at a 90 degree position relative to the real axis. Therefore, since the angular velocity of the vector V is zero, the PWM control unit 73 outputs a pulse train with a 50% duty ratio, the crystal oscillator 1 is supplied with a 2 V voltage, and its output frequency is 40 MHz.

Figure 11:
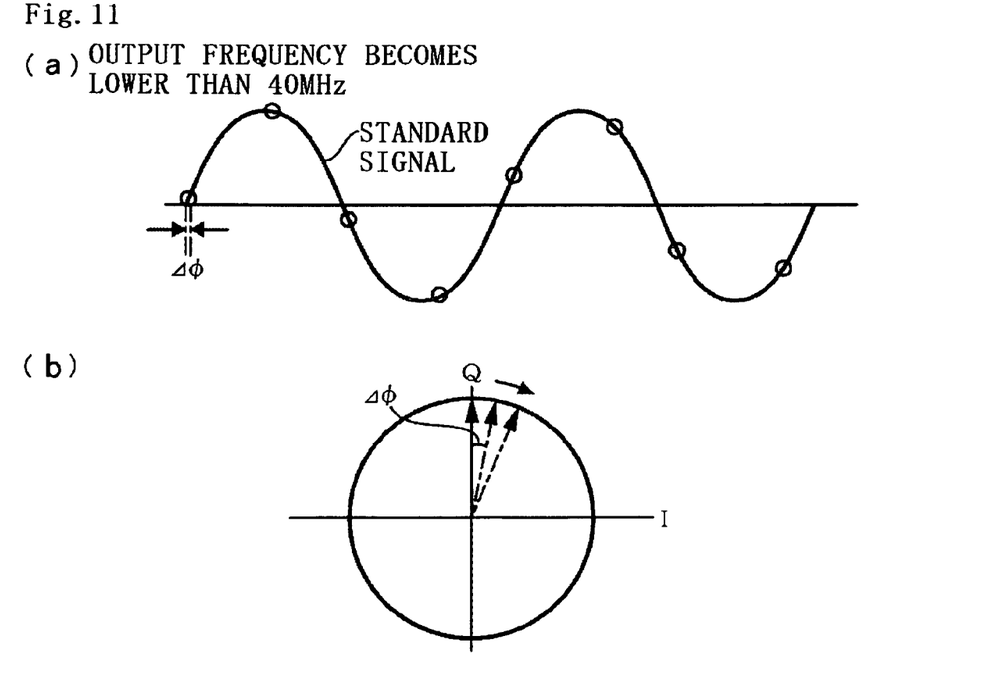
FIG. 11 are explanatory charts showing a state of sampling and a vector when the phase difference between the standard signal and the frequency signal of the voltage-controlled oscillation unit changes.

Here, assuming that the output frequency of the voltage-controlled oscillator 1 becomes lower than 40 MHz, the sampling timings which have been 0 degree, 90 degrees, 180 degrees, and 270 degrees as shown in FIG. 11(a) change to 0 degree, Δφ, 90 degrees+2Δφ, 180 degrees+3Δφ, and 270 degrees+4Δφ and the vector V starts rotating right at the angular velocity Δφ as shown in FIG. 11(b). Incidentally, since the vector is extracted based on the timing of the 20 MHz clock, the angular velocity is Δφ/25 ns, but is written as Δφ for convenience sake. In accordance with this angular velocity Δφ, the duty ratio increases, so that the input voltage of the crystal oscillator 1 increases, its output frequency increases by the angular velocity Δφ, that is, by an amount corresponding to the change amount Δφ of the phase difference, and as a result, the output frequency of the crystal oscillator 1 is locked to 40 MHz.

According to the above-described embodiment, the A/D conversion unit 11 samples the external standard signal based on the frequency signal from the voltage-controlled oscillator 1, the vector is obtained as a result of the orthogonal transformation of the sampling value, and the vector is monitored. Therefore, since the phase difference between the frequency signal from the crystal oscillator 1 and the standard signal is handled as a digital value, it is possible to fix the phase difference highly accurately by adjusting the bit numbers of the digital value, and when the standard signal has high frequency stability, it is possible to obtain the frequency signal with a desired frequency with extremely high frequency stability. Further, the digital filter unit 72 and the analog loop filter 12 can adjust the frequency lead-in time by the time constant, and by adjusting the lead-in time to, for example, about 10 seconds by such adjustment, it is possible to prevent frequency jump.

Figure 12:
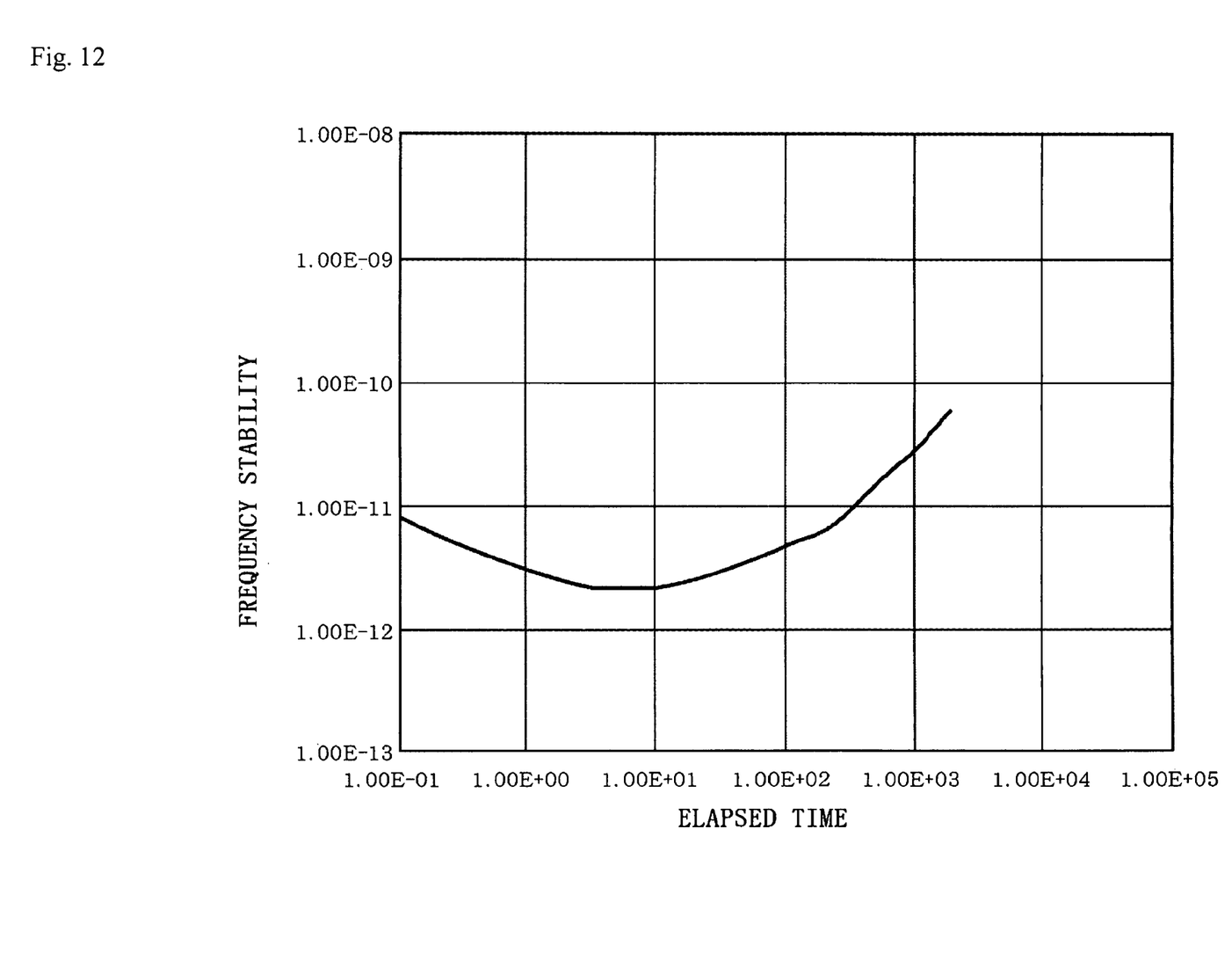
FIG. 12 is a characteristic chart showing a frequency stability characteristic of the OCXO when the present invention is not carried out.
Figure 13:
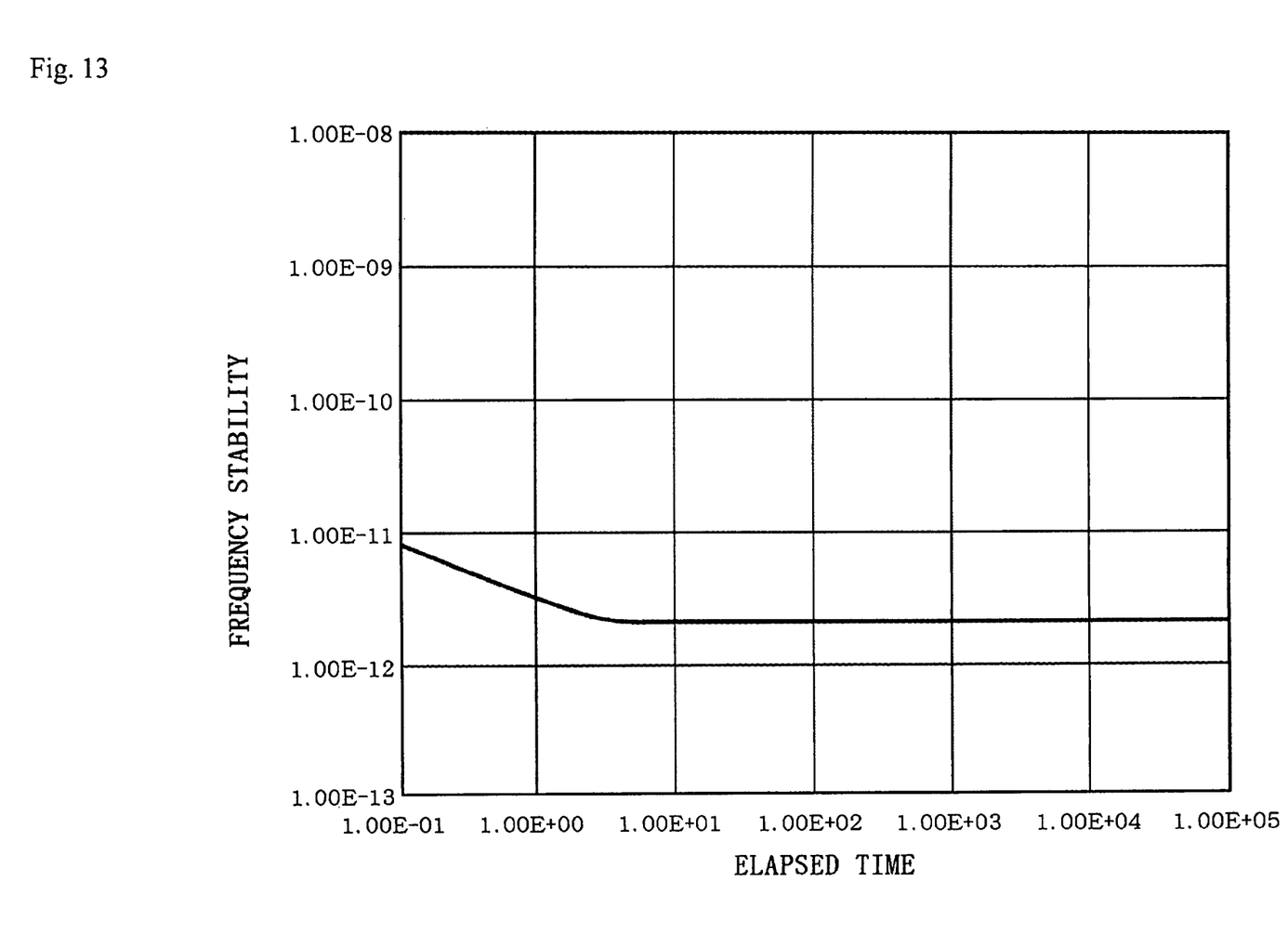
FIG. 13 is a characteristic chart showing a frequency stability characteristic of the OCXO when the present invention is carried out.

FIG. 12 shows a frequency stability characteristic of the OCXO. The OCXO has good short-term stability but the stability tends to worsen with time. On the other hand, as is seen in FIG. 13, by incorporating the OCXO into the above-described embodiment, good long-term stability similar to the short-term stability can be realized.

Further, in the present invention, the relation between the frequency of the standard signal and the output frequency of the voltage-controlled oscillation unit is not limited to 1:4. This ratio may be any, but the output frequency of the voltage-controlled oscillation unit needs to be twice as high as the frequency of the standard signal or more. Even when the ratio of the both frequencies is not 1:4, it is possible to find the I value and the Q value by selecting the frequencies based on the sampling theorem. Specifically, an orthogonal transformation unit (carrier remove) generally uses a sinusoidal signal with a $\omega_0 t/2\pi$ frequency ($\omega_0$ angular velocity) when performing quadrature detection of a sinusoidal signal which is specified by the digital signal from the A/D conversion unit 11, and can extract a vector which rotates at a frequency equal to a difference between the frequency of the frequency signal specified by the digital signal of the A/D conversion unit 11 and the frequency of the sinusoidal signal used in the detection. In more detail, the real part and the imaginary part which are complex expression of this vector can be extracted. Concretely, the carrier remove can have the output line of the A/D conversion unit 11 branch off, and can include a multiplying unit multiplying the sinusoidal signal by $\cos(\omega_0 t)$, a multiplying unit multiplying the sinusoidal signal by $-\sin(\omega_0 t)$, and low-pass filters provided on subsequent stages of these multiplying units.

The invention claimed is:

1. A PLL apparatus comprising:
a voltage-controlled oscillation unit oscillating a frequency signal according to a supplied direct-current voltage;
an analog/digital conversion unit sampling an external standard signal which is a stable sinusoidal signal, based on the frequency signal from said voltage-controlled oscillation unit, and outputting a sampling value as a digital signal;
an orthogonal transformation unit applying orthogonal transformation to the digital signal by an orthogonal transformation unit to extract a real part and an imaginary part which are complex expression of a phase vector equivalent to a phase difference between the frequency signal and the standard signal;
an angular velocity calculation unit calculating an angular velocity of the vector based on time-series data of the real part and the imaginary part extracted by said orthogonal transformation unit; and
a means for supplying said voltage-controlled oscillation unit with the direct-current voltage according to the angular velocity calculated by said angular velocity calculation unit.

2. The PLL apparatus according to claim 1, wherein said means for supplying said voltage-controlled oscillation unit with the direct-current voltage includes: a pulse width modulation unit outputting a pulse train with a duty ratio according to the angular velocity of the vector; and a means for smoothing the pulse train output from the pulse width modulation unit.

3. The PLL apparatus according to claim 1, wherein said angular velocity calculation unit finds the angular velocity of the vector based on an arithmetic operation of $\{Q(n)-Q(n-1)\} \cdot I(n) - \{I(n)-I(n-1)\} Q(n)$, where $I(n)$ and $Q(n)$ are respectively the real part and the imaginary part corresponding to the sampling value at a given timing, and $I(n-1)$ and $Q(n-1)$ are respectively the real part and the imaginary part corresponding to the sampling value at a timing preceding the given timing.

4. The PLL apparatus according to claim 1, wherein said voltage-controlled oscillation unit is an oven-controlled crystal oscillator.

* * * * *